(12) United States Patent
Tsai et al.

(10) Patent No.: US 7,692,475 B2
(45) Date of Patent: Apr. 6, 2010

(54) SWITCH CIRCUIT

(75) Inventors: Shih-Kuang Tsai, Shanghai (CN); Jing-Xin Liang, Shanghai (CN)

(73) Assignee: Inventec Appliances Corp., Taipei Hsien (TW)

( * ) Notice: Subject to any disclaimer, the term of this patent is extended or adjusted under 35 U.S.C. 154(b) by 51 days.

(21) Appl. No.: 12/197,486

(22) Filed: Aug. 25, 2008

(65) Prior Publication Data
US 2009/0051407 A1    Feb. 26, 2009

(30) Foreign Application Priority Data
Aug. 24, 2007    (TW) .............................. 96214163 U

(51) Int. Cl.
H03K 17/687    (2006.01)

(52) U.S. Cl. ................. 327/427; 327/387; 327/389; 327/391

(58) Field of Classification Search .................. None
See application file for complete search history.

(56) References Cited

U.S. PATENT DOCUMENTS 6,335,654 B1*   1/2002   Cole ........................... 327/546
6,486,718 B1*  11/2002   Stelle et al. .................. 327/198
6,717,456 B2*   4/2004   Watanabe .................... 327/437
2007/0103210 A1*  5/2007   Hsu ............................ 327/143

* cited by examiner

*Primary Examiner*—Tuan Lam
(74) *Attorney, Agent, or Firm*—Muncy, Geissler, Olds & Lowe, PLLC

(57) ABSTRACT

A switch circuit is disclosed. The switch circuit comprises: a hysteresis buffer, an electric switch, a first discharge resistor, a second discharge resistor, a capacitor, a feedback resistor, a first reciprocal switch, and a second reciprocal switch. When the second reciprocal switch is turned on, a power supply voltage charges the capacitor, and thus the voltage on the signal input terminal of the hysteresis buffer is decreased. Accordingly, the voltage on the signal output terminal of the hysteresis buffer is decreased, so as to turn on the electric switch. When the first reciprocal switch is turned on, the capacitor is discharged, and thus the voltage on the signal input terminal of the hysteresis buffer is increased. Accordingly, the voltage applied to the signal output terminal of the hysteresis buffer is increased, so as to turn off the electric switch.

6 Claims, 3 Drawing Sheets

SWITCH CIRCUIT

RELATED APPLICATIONS

This application claims priority to Taiwan Application Serial Number 96214163, filed Aug. 24, 2007, which is herein incorporated by reference.

FIELD OF THE INVENTION

This invention relates to a switch circuit, and more particularly, to a switch circuit with a hysteresis buffer.

BACKGROUND OF THE INVENTION

Refer to FIG. 1. FIG. 1 is a circuit diagram showing a power switch of a conventional electric device. Conventional technology uses a latch type switch 12 to determine if a power supply voltage 14 is provided to an electric device 16. However, latch type switches are more expensive than normal electric switches, such as a transistor switch, and the latch type switch cannot buffer the power supply voltage. When the latch type switch is turned on, the power supply voltage 14 is immediately provided to the electric device 16, thereby leading to current spike effect.

Therefore, a new, cheaper switch circuit with a buffer function is required.

SUMMARY OF THE INVENTION

An aspect of the present invention is to provide a switch circuit using the hysteresis effect of a hysteresis buffer to control an electric circuit.

According to an embodiment of the present invention, the switch circuit comprises a hysteresis buffer, an electric switch, a first discharge resistor, a second discharge resistor, a capacitor, a feedback resistor, a first reciprocal switch, and a second reciprocal switch. The hysteresis buffer has a power input terminal, a first signal input terminal, a first signal output terminal and a ground terminal, wherein the power input terminal is electrically connected to a power supply voltage, and the ground terminal is electrically connected to a ground voltage. The electric switch has a second signal input terminal, a second signal output terminal, and a control terminal, wherein the control terminal is electrically connected to the first signal output terminal, and the second signal input terminal is electrically connected to the power supply voltage, and the second signal output terminal is electrically connected to a load. One terminal of the first discharge resistor is electrically connected to the power supply voltage, and the other terminal of the first discharge resistor is electrically connected to the first signal output terminal. One terminal of the capacitor is electrically connected to the power supply voltage, and the other terminal is electrically connected to the first signal input terminal. One terminal of the feedback resistor is electrically connected to the first signal output terminal, and the other terminal of the feedback resistor is electrically connected to the first signal input terminal. The first reciprocal switch has a third signal input terminal and a third signal output terminal, wherein the third signal input terminal is electrically connected to the power supply voltage. The second reciprocal switch has a fourth signal input terminal and a fourth signal output terminal, wherein the fourth signal input terminal is electrically connected to the third signal output terminal, and the fourth signal output terminal is electrically connected to the ground voltage. One terminal of the second discharge resistor is electrically connected to the first signal input terminal, and the other terminal of the second discharge resistor is electrically connected to the third signal output terminal.

According to another embodiment of the present invention, the electric switch is a transistor switch.

According to still another embodiment of the present invention, the load is a digital photo frame.

According to further another embodiment of the present invention, the switch circuit further comprises a power connector by which the power input terminal is connected to the power supply voltage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
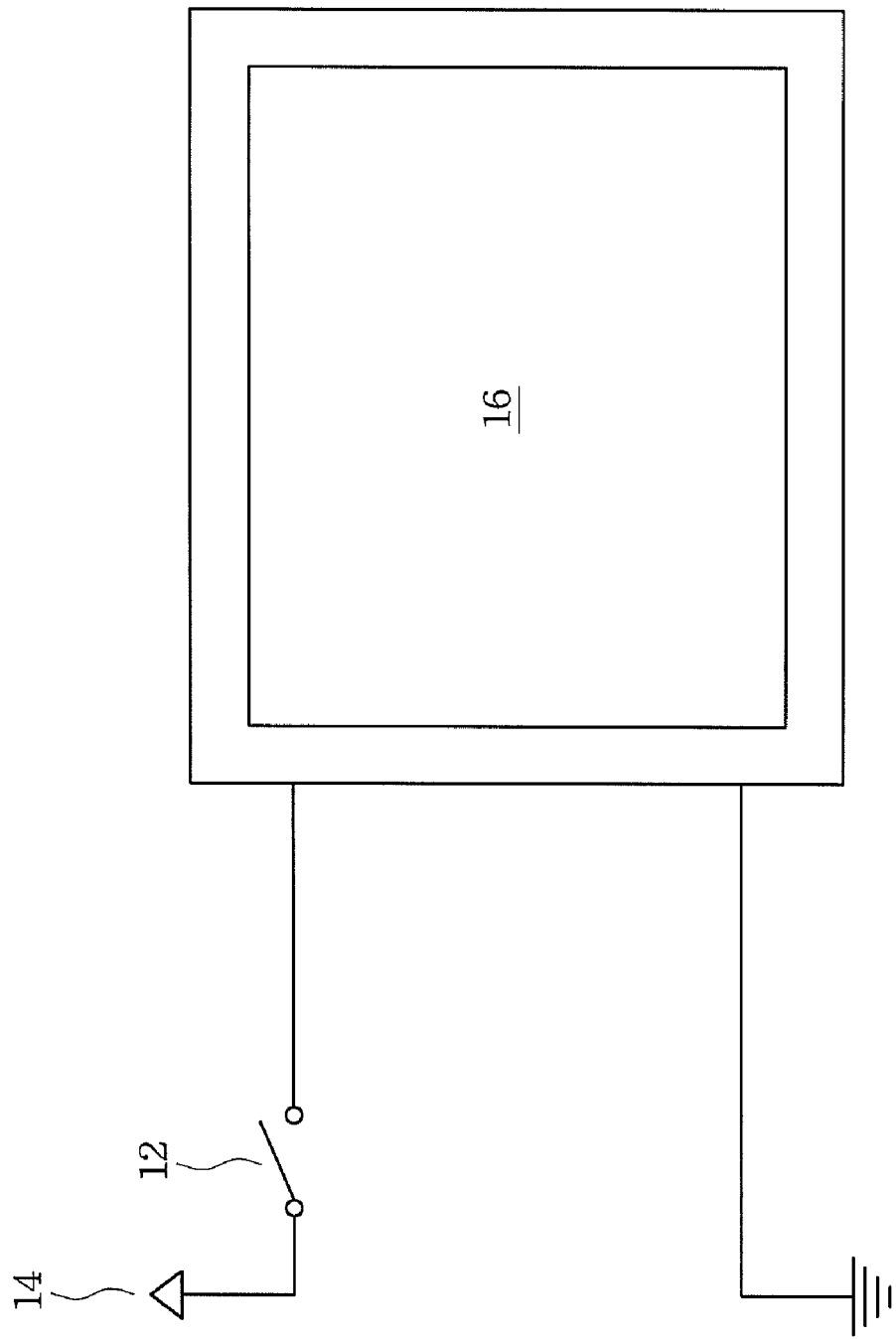
FIG. 1 is a circuit diagram showing a power switch of a conventional electric device.
Figure 2:
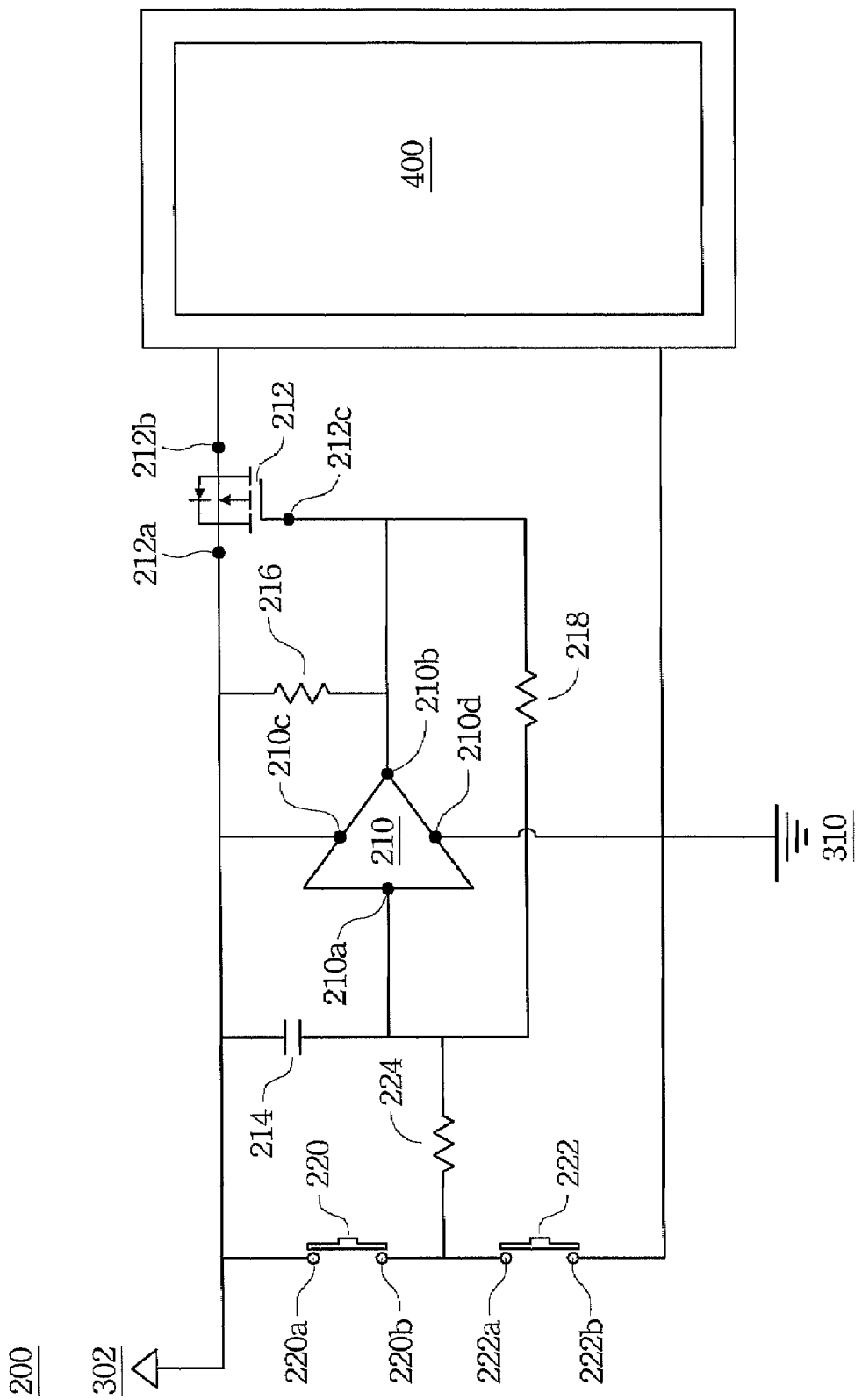
FIG. 2 is a circuit diagram showing a switch circuit 200 according to an embodiment of the present invention.
Figure 3:
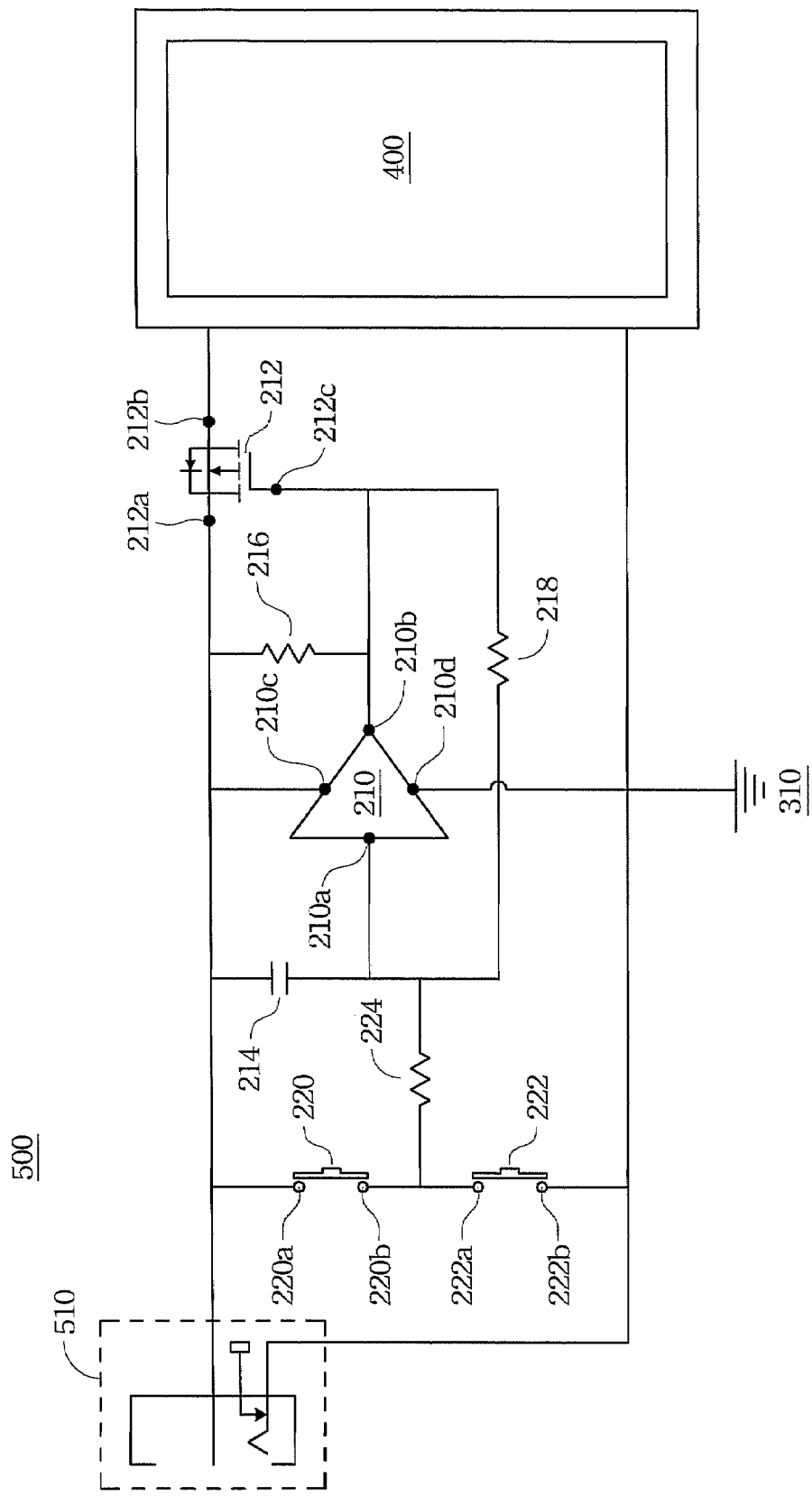
FIG. 3 is a circuit diagram showing a switch circuit 500 according to another embodiment of the present invention.

In order to make the illustration of the present invention more explicit and complete, the following description is stated with reference to FIG. 2 through FIG. 3

Refer to FIG. 2. FIG. 2 is a circuit diagram showing a switch circuit 200 according to an embodiment of the present invention. The switch circuit 200 comprises a hysteresis buffer 210, an electric switch 212, a capacitor 214, a discharge resistor 216, a feedback resistor 218, a reciprocal switch 220, a reciprocal switch 222, and a discharge resistor 224, wherein the resistance of the discharge resistor 224 is smaller than that of the feedback resistor 218. The hysteresis buffer 210 has a signal input terminal 210a, a signal output terminal 210b, a power input terminal 210c, and a ground terminal 210d. The power input terminal 210c is electrically connected to a power supply voltage 302, and the ground terminal 210d is electrically connected to a ground voltage 310.

The electric switch has a signal input terminal 212a, a signal output terminal 212b, and a control terminal 212c. The signal input terminal 212a is electrically connected to the power supply voltage 302. The second signal output terminal 212b is electrically connected to a load 400. The control terminal 212c is electrically connected to the signal output terminal 210b of the hysteresis buffer 210. In this embodiment, for example, the hysteresis buffer 210 is a Schmitt buffer, and the electric switch 212 is a P type transistor, and the reciprocal switch 220 and 230 are button switches, and the load 400 is a photo frame. It is noted that the above description is illustrative, rather than limiting.

One terminal of the capacitor 214 is electrically connected to a power supply voltage 302, and the other terminal of the capacitor 214 is electrically connected to the signal input terminal 210a. One terminal of the discharge resistor 216 is electrically connected to the power supply voltage 302, and other terminal of the discharge resistor 216 is electrically connected to the signal output terminal 210a of the hysteresis buffer 210. One terminal of the feedback resistor 218 is electrically connected to the signal output terminal 210b of the hysteresis buffer 210, and the other terminal of the feedback resistor 218 is electrically connected to the signal input terminal 210a of the hysteresis buffer 210.

The reciprocal switch 220 has a signal input terminal 220a and a signal output terminal 220b, and the reciprocal switch 222 has a signal input terminal 222a and a signal output terminal 222b. The signal input terminal 220a is electrically connected to the power supply voltage 302, and the signal output terminal 220b of the reciprocal switch 220 is electrically connected to the signal input terminal 222a of the reciprocal switch 222. The signal output terminal 222b of the reciprocal switch 222 is electrically connected to the ground voltage 310.

One terminal of the discharge resistor 224 is electrically connected to the signal input terminal 210a of the hysteresis buffer 210, and the other terminal of the discharge resistor 224 is electrically connected to the signal output terminal 220b of the reciprocal switch 220.

In the following description, the work function of the switch circuit 200 is described in detail.

Referring to FIG. 2 again. When the reciprocal switches 220 and 222 are turned off by, for example, opening the reciprocal switches 220 and 222, no signal is applied to the signal input terminal 210a of the hysteresis buffer 210, therefore the electric switch 212 is turned off. Thereafter, when the reciprocal switch 222 is turned on by, for example, closing the reciprocal switch 222 (the reciprocal switch 220 is still turned off at this time), the power supply voltage 302 charges the capacitor 214, therefore the voltage level of the signal input terminal 210a and the signal output terminal 210b of the hysteresis buffer 210 are decreased. When the voltage level of the signal output terminal 210b is lower than the threshold voltage level of the electric switch 212, the electric switch 212 is therefore turned on, and the power supply voltage 302 is provided to the load 400 to enable the load 400 to start working. Because of the hysteresis buffer 210, the current spike effect is decreased when the electric switch 212 is turned on.

It is noted that when the reciprocal switch 222 is turned off again thereafter (the reciprocal switch 220 is still turned off at this time), the voltage level of the signal input terminal 210a of the hysteresis buffer 210 is kept low due to the hysteresis function of the hysteresis buffer 210 and the feedback function of the feedback resistor 218. Therefore, the electric switch 212 is still turned on. In addition, the capacitor 214 can buffer the power supply voltage 302 when the reciprocal switch 222 is turned on.

The reciprocal switch 220 can be turned on, by eg closing the reciprocal switches 220, to stop the load 400 from working (the reciprocal switch 222 is turned off at this time), when the load 400 works. Because the resistance of the discharge resistor 224 is smaller than that of the feedback resistor 218, the capacitor 214 is discharged when the reciprocal switch 220 is turned off, thereby increasing the voltage level of the signal input terminal 210a and the signal output terminal 210b of the hysteresis buffer 210. When the voltage level of the signal input terminal 210a is higher than the threshold voltage level of the electric switch 212, the electric switch 212 is turned off to stop providing power supply voltage 302 to the load 400 to stop the load 400 from working.

It is noted that when the reciprocal switch 220 is turned off again thereafter (the reciprocal switch 222 is turned off at this time), the voltage level of the signal input terminal 210a of the hysteresis buffer 210 is kept high due to the hysteresis function of the hysteresis buffer 210 and the feedback function of the feedback resistor 218. Therefore, the electric switch 212 is still turned off. In addition, the discharge resistor 216 can provide a discharging path to discharge the capacitor 214.

Comparing the switch circuit 200 of this embodiment and the power switch of the conventional technology, this embodiment has the advantages of long lifetime, low current spike, and low cost.

Refer to FIG. 3. FIG. 3 is a circuit diagram showing a switch circuit 500 according to another embodiment of the present invention. The switch circuit 500 is similar to the switch circuit 200, but the difference is that the switch circuit 500 further comprises a power connector 510, such as a jack. In this embodiment, the power supply voltage 302 is electrically connected to the switch circuit 500 through the connector 510. Users can use the connector 510 to electrically separate the power supply voltage 302 and the switch circuit 500 when the users do not use the load 400 in a long time, so that the lifetime of the switch circuit 500 can be increased.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A switch circuit comprising:

a hysteresis buffer having a power input terminal, a first signal input terminal, a first signal output terminal, and a ground terminal, wherein the power input terminal is electrically connected to a power supply voltage, and the ground terminal is electrically connected to a ground voltage;

an electric switch having a second signal input terminal, a second signal output terminal, and a control terminal, wherein the control terminal is electrically connected to the first signal output terminal, and the second signal input terminal is electrically connected to the power supply voltage, and the second signal output terminal is electrically connected to a load;

a first discharge resistor, wherein one terminal of the first discharge resistor is electrically connected to the power supply voltage, and the other terminal of the first discharge resistor is electrically connected to the first signal output terminal;

a capacitor, wherein one terminal of the capacitor is electrically connected to the power supply voltage, and the other terminal of the capacitor is electrically connected to the first signal input terminal;

a feedback resistor, wherein one terminal of the feedback resistor is electrically connected to the first signal output terminal, and the other terminal of the feedback resistor is electrically connected to the first signal input terminal;

a first reciprocal switch having a third signal input terminal and a third signal output terminal, wherein the third signal input terminal is electrically connected to the power supply voltage;

a second reciprocal switch having a fourth signal input terminal and a fourth signal output terminal, wherein the fourth signal input terminal is electrically connected to the third signal output terminal, and the fourth signal output terminal is electrically connected to the ground voltage; and a second discharge resistor, wherein one terminal of the second discharge resistor is electrically connected to the first signal input terminal, and the other terminal of the second discharge resistor is electrically connected to the third signal output terminal.

2. The switch circuit of claim 1, wherein the electric switch is a transistor switch.

3. The switch circuit of claim 1, wherein the load is a digital photo frame.

4. The switch circuit of claim 1, further comprising a power connector by which the power input terminal is connected to the power supply voltage.

5. The switch circuit of claim 1, wherein the hysteresis buffer is a Schmitt buffer.

6. The switch circuit of claim 1, wherein the resistance of the second discharge resistor is smaller than that of the feedback resistor.

* * * * *